United States Patent

Frank et al.

(10) Patent No.: US 7,844,933 B2
(45) Date of Patent: Nov. 30, 2010

(54) METHODS OF OPTIMIZING TIMING OF SIGNALS IN AN INTEGRATED CIRCUIT DESIGN USING PROXY SLACK VALUES

(75) Inventors: Joseph M. Frank, Poughkeepsie, NY (US); David J. Hathaway, Underhill, VT (US); Kerim Kalafala, Rhinebeck, NY (US)

(73) Assignee: International Business Machines Corporation, Armonk, NY (US)

(*) Notice: Subject to any disclaimer, the term of this patent is extended or adjusted under 35 U.S.C. 154(b) by 391 days.

(21) Appl. No.: 12/113,288

(22) Filed: May 1, 2008

(65) Prior Publication Data

US 2009/0276743 A1 Nov. 5, 2009

(51) Int. Cl.
*G06F 17/50* (2006.01)
(52) U.S. Cl. .............................. 716/6; 716/1
(58) Field of Classification Search .............. 716/1, 716/6
See application file for complete search history.

(56) References Cited

U.S. PATENT DOCUMENTS

| | | | |
|---|---|---|---|
| 6,615,395 B1* | 9/2003 | Hathaway et al. | 716/6 |
| 7,716,612 B1* | 5/2010 | Gupta et al. | 716/2 |
| 2004/0230921 A1* | 11/2004 | Hathaway et al. | 716/2 |
| 2006/0010411 A1* | 1/2006 | Curtin et al. | 716/6 |
| 2007/0143722 A1* | 6/2007 | Venkateswaran et al. | 716/6 |
| 2007/0220469 A1* | 9/2007 | Drumm et al. | 716/7 |
| 2009/0013294 A1* | 1/2009 | Visweswariah | 716/6 |
| 2009/0083685 A1* | 3/2009 | Gidon et al. | 716/6 |
| 2009/0106709 A1* | 4/2009 | Carney et al. | 716/2 |
| 2009/0241078 A1* | 9/2009 | Hemmett et al. | 716/6 |
| 2009/0249270 A1* | 10/2009 | Buck et al. | 716/6 |
| 2009/0265674 A1* | 10/2009 | Buck et al. | 716/6 |
| 2009/0288051 A1* | 11/2009 | Hemmett et al. | 716/6 |

* cited by examiner

*Primary Examiner*—Jack Chiang
*Assistant Examiner*—Magid Y Dimyan
(74) *Attorney, Agent, or Firm*—Gibb I.P. Law Firm, LLC

(57) ABSTRACT

A method of optimizing timing of signals within an integrated circuit design using proxy slack values propagates signals through the integrated circuit design to output timing signals. For early mode timing analysis, the method sets an early proxy slack value to zero if the late slack value is less than zero. Otherwise, if the late slack value is not less than zero, the method restricts the early proxy slack value to a maximum of the early slack value and the negative of the late slack value. To the contrary, for late mode timing analysis, the method sets a late proxy slack value to zero if the early slack value is less than zero. Otherwise, if the early proxy slack value is not less than zero, the method restricts the late proxy slack value to a maximum of the late slack value and the negative of the early slack value.

6 Claims, 2 Drawing Sheets

METHODS OF OPTIMIZING TIMING OF SIGNALS IN AN INTEGRATED CIRCUIT DESIGN USING PROXY SLACK VALUES

BACKGROUND

1. Field of the Invention

The embodiments of the invention generally relate to circuit design timing analysis, and, more particularly, to methods of optimizing timing of signals within an integrated circuit design using proxy slack values.

2. Description of the Related Art

Optimization transforms typically attempt to improve late (early) mode timing by speeding up (slowing down) data path delays. Unfortunately, transforms which only consider late (or early) mode slack values run the risk of making a violation in the opposite mode worse. For example, a transform which speeds up a late mode path in order to correct for a late mode slack value could end making an early mode violation worse, resulting in the need for iteration between early and late mode timing correction.

Conventional techniques require that optimization transforms explicitly check both early and late mode slack values in order to ensure that potential changes do not unexpectedly degrade results in the "opposite" mode. A large number of existing transforms exist, however, which only refer to the late mode slack values, and re-writing these to explicitly check early and late mode slacks would be extremely cumbersome. In considering both early and late timing it is also important to recognize that the delays used in these analyses are not the same (the late mode delay for an arc is larger than the early mode delay for the same arc).

SUMMARY

In view of the foregoing, an embodiment of the invention provides methods of optimizing timing of signals within an integrated circuit design using proxy slack values. With embodiments herein, a single proxy late (early) mode slack value is computed to guide optimization towards those paths which can be improved in a late (early) mode sense without adversely impacting the early (late) mode results.

One method propagates signals through the integrated circuit design to output timing signals. The timing signals comprise at least one late slack value associated with a longest path through the integrated circuit design and at least one early slack value associated with a shortest path through the integrated circuit design.

For early mode timing analysis, if the late slack value is less than zero, the method sets an early proxy slack value to zero. Otherwise, if the late slack value is not less than zero, the method restricts the early proxy slack value to a maximum of the early slack value and the negative of the late mode slack value. Thus, to use an oversimplified numerical example, if the late slack value is +2 and the early slack value is −4, the early proxy slack value will be restricted to −2.

For late mode timing analysis, again, if the early slack value is less than zero, the method sets a late proxy slack value to zero. Otherwise, if the early proxy slack value is not less than zero, the method restricts the late proxy slack value to a maximum of the late slack value and the negative of the early mode slack value.

With these proxy values established, the method can then perform timing optimization with the early proxy slack value and the late proxy slack value to produce optimized timing values, which are then output as the optimized timing values for the integrated circuit design. This method adjusts the early proxy slack value without affecting the late proxy slack value and adjusts the late proxy slack value without affecting the early proxy slack value.

An alternative method establishes an early slack threshold value and a late slack threshold value. Again, the method propagates signals through the integrated circuit design to output the timing signals (late slack values and early slack values).

In this alternative method, for early mode analysis, if the late slack value is less than the late slack threshold value, the method sets the early proxy slack value to the early slack threshold value. Otherwise, if the late slack value is not less than late slack threshold value, the method restricts the early proxy slack value to a maximum of the early slack value and the early threshold minus the difference between the late slack value and late slack threshold value.

For late mode timing analysis, if the early slack value is less than early slack threshold value, the method sets the late proxy slack value to the late slack threshold value. Otherwise, if the early slack value is not less than early slack threshold value, the method restricts the late proxy slack value to a maximum of the late slack value, and the late threshold minus the difference between the early slack value and the early slack threshold values.

This alternative embodiment also performs timing optimization with the early proxy slack value and the late proxy slack value to produce optimized timing values, which are then output as the optimized timing values for the integrated circuit design.

As a further refinement, the method can establish a range of delay ratios from an alpha minimum to an alpha maximum. Thus, when restricting the early proxy slack value, the method restricts the early proxy slack value to a maximum of the early slack value, and the early slack threshold value minus (the late slack value minus the late slack threshold value, divided by the alpha minimum). Similarly, when restricting the late proxy slack value such a value is restricted to a maximum of the late slack value, and the late slack threshold value minus (the early slack value minus the early slack threshold value, multiplied by the alpha maximum).

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
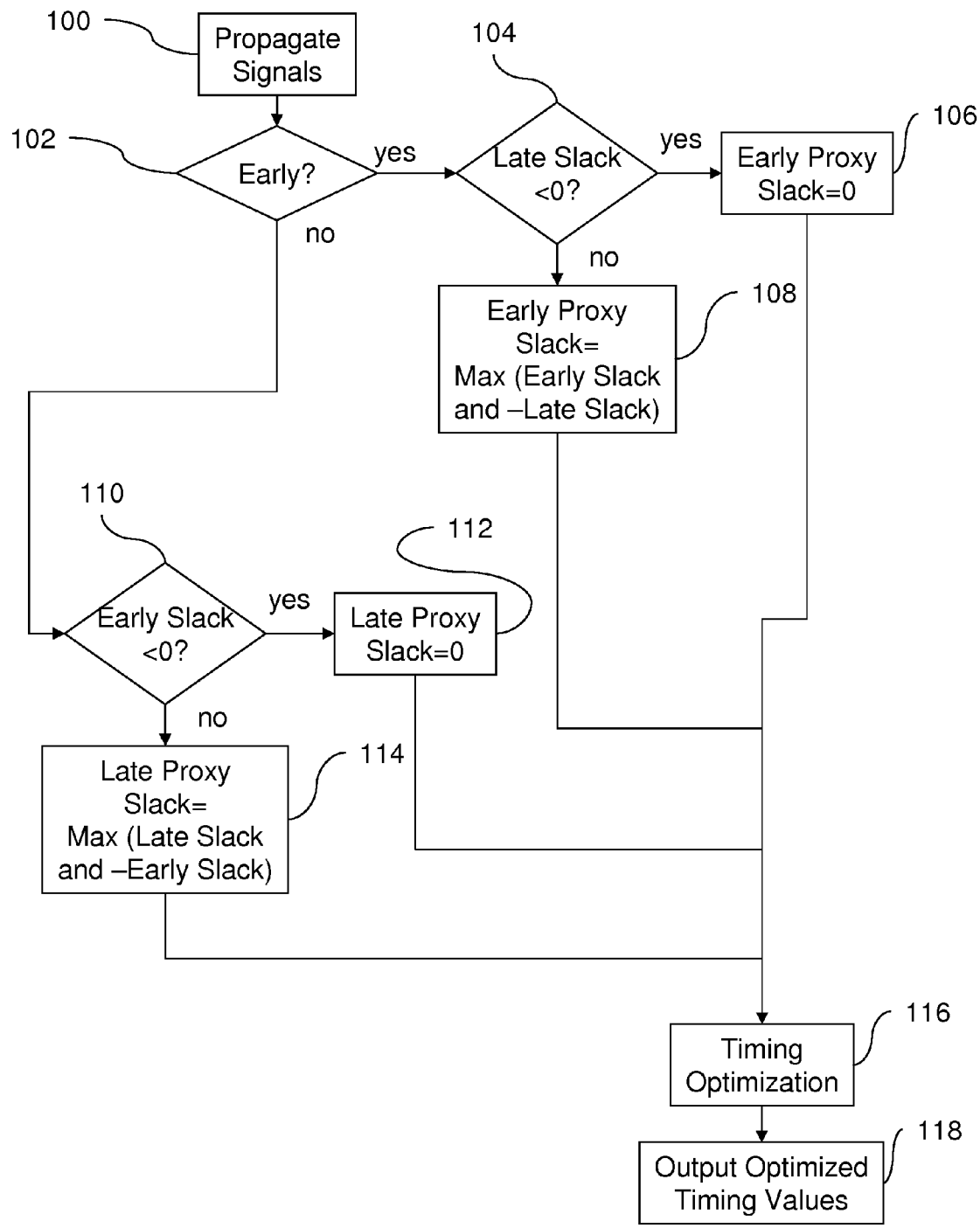
FIG. 1 is a flow diagram illustrating a method embodiment herein.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

The embodiments herein diverge from conventional operations because, rather than computing separate early and late slack values, the embodiments herein compute a proxy slack based on a combination of both early and late mode slack values.

The methods herein compute a single proxy late (early) mode slack to guide optimization towards those paths which can be improved in a late (early) mode sense without adversely impacting the early (late) mode results. The optimization operations would then operate only on points which have a negative value of this proxy slack, and by doing so would ensure that the improvements to the timing mode under consideration would not cause new timing problems in the other timing mode.

The first embodiment discussed herein assumes a slack threshold below which timing corrections must be made of zero.

For use in correcting early mode problems without introducing late mode problems:
  Early proxy slack=0 if late_slack<0
  max (early_slack, -late_slack) otherwise For use in correcting late mode problems without introducing early mode problems:
  Late slack proxy=0 if early_slack<0
  max (late_slack, -early_slack) otherwise.

In another words, for early mode timing analysis, if the late slack value is less than zero, the method sets an early proxy slack value to zero. Otherwise, if the late slack is not less than zero, the method restricts the early proxy slack value to a maximum of the early slack and the negative of the late mode slack. Thus, to use an oversimplified numerical example, if the late slack is +2 and the early slack is −4, the early proxy slack value will be restricted to −2. For late mode timing analysis, again, if the early slack value is less than zero, the method sets a late proxy slack value to zero. Otherwise, if the early proxy slack is not less than zero, the method restricts the late proxy slack value to a maximum of the late slack and the negative of the early mode slack.

In another embodiment, if the slack thresholds below which corrections will be made are early_slack_threshold and late_slack_threshold, the following early and late mode proxy slacks would be used.

For use in correcting early mode problems without introducing late mode problems:
  Early proxy slack=early_slack_threshold if late_slack<late_slack_threshold max (early_slack, early_slack_threshold−(late_slack−late_slack_threshold)) otherwise For use in correcting late mode problems without introducing early mode problems:
  Late slack proxy=late_slack_threshold if early_slack<early_slack_threshold max (late_slack, late_slack_threshold−(early_slack−early_slack_threshold)) otherwise.

In other words, in this embodiment, for early mode analysis, the method sets the early proxy slack value to the early slack threshold value if the late slack value is less than late slack threshold value. Otherwise, if the late slack value is not less than late slack threshold value, the method restricts the early proxy slack value to a maximum of the early slack value and the early threshold minus the difference between the late slack and late slack threshold. For late mode timing analysis, the method sets the late proxy slack value to the late slack threshold value if the early slack value is less than early slack threshold value. Otherwise, if the early slack value is not less than early slack threshold value the method restricts the late proxy slack value to a maximum of the late slack value, and the late threshold minus the difference between the early slack and the early slack threshold values.

If, in addition, a range of late/early delay ratios from alpha_min to alpha_max is known, the following slack proxies would be used.

For use in correcting early mode problems without introducing late mode problems:
  Early proxy slack=early_slack_threshold if late_slack<late_slack_threshold
  max (early_slack, early_slack_threshold−(late_slack−late_slack_threshold)/alpha_min) otherwise For use in correcting late mode problems without introducing early mode problems:
  Late slack proxy=late_slack_threshold if early_slack<early_slack_threshold
  max (late_slack, late_slack_threshold−(early_slack−early_slack_threshold)*alpha_max) otherwise In other words, as a further refinement, the method can establish a range of delay ratios from an alpha minimum to an alpha maximum. Thus, when restricting the early proxy slack value such a value is restricted to a maximum of the early slack value, and the early slack threshold value minus (the late slack value minus the late slack threshold value, divided by the alpha minimum). Similarly, when restricting the late proxy slack value such a value is restricted to a maximum of absolute values of the late slack value, and the late slack threshold value minus (the early slack value minus the early slack threshold value, multiplied by the alpha maximum).

Note that the slack ratio alpha can also be used independently of the proxy slack concept. An optimization transform proposing a delay increase to improve an early mode problem would do so only if the added delay being introduced is less than (late_slack−late_slack_threshold)/alpha_min. Similarly, an optimization transform proposing a delay decrease to improve a late mode problem would do so only if the delay reduction being introduced is less than (early_slack−early_slack_threshold)*alpha_max.

The foregoing concepts are also shown in flowchart form in the accompanying drawings. As shown in flowchart form in FIG. 1, one embodiment of the invention provides methods of optimizing timing of signals within an integrated circuit design using proxy slack values. In item 100, the method propagates signals through the integrated circuit design to output timing signals. The timing signals comprise at least one late slack value associated with a longest path through the integrated circuit design and at least one early slack value associated with a shortest path through the integrated circuit design. For a complete discussion of such timing analyses, see U.S. Patent Publication 2005/0243869, the complete disclosure of which is incorporated herein by reference.

For early mode timing analysis, as indicated by decision box 102, and if the late slack value is less than zero as indicated by decision box 104, the method sets an early proxy slack value to zero in item 106. Alternatively, since the objective in this case is to prevent the early proxy slack from being negative and causing the timing optimization to increase the delay and exacerbate a late mode problem, the method could set the early proxy slack value to max (0, early slack). Otherwise, if the late slack is not less than zero, the method restricts the early proxy slack value to a maximum of the early slack and the negative of the late mode slack as indicated in item 108. Thus, to use an oversimplified numerical example, if the late slack is +2 and the early slack is −4, the early proxy slack value will be restricted to −2.

For late mode timing analysis, again as indicated by decision box 102, and if the early slack value is less than zero, as indicated by decision box 110, the method sets a late proxy slack value to zero in item 112. Alternatively, since the objective in this case is to prevent the late proxy slack from being negative and causing the timing optimization to reduce the delay and exacerbate an early mode problem, the method could set the late proxy slack value to max (0, late slack). Otherwise, if the early proxy slack is not less than zero, the method restricts the late proxy slack value to a maximum of the late slack and the negative of the early mode slack as indicated in item 114.

With these proxy values established, the method can then perform timing optimization in item 116 with the early proxy slack value and the late proxy slack value to produce optimized timing values, which are then output as the optimized timing values for the integrated circuit design. This method adjusts the early proxy slack value without affecting the late proxy slack value and adjusts the late proxy slack value without affecting the early proxy slack value.

Figure 2:
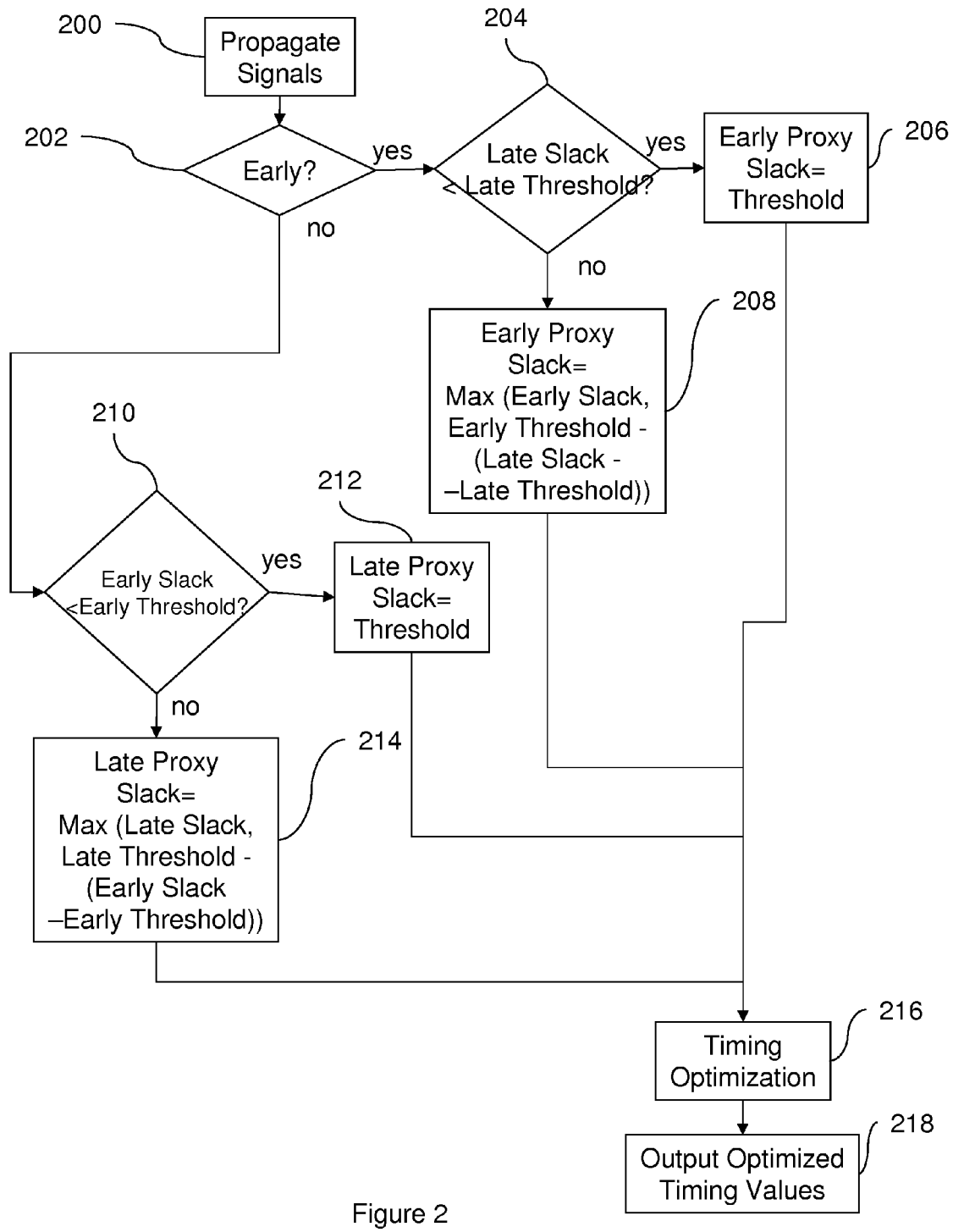
FIG. 2 is a flow diagram illustrating a method embodiment herein.

An alternative method shown in FIG. 2 establishes an early slack threshold value and a late slack threshold value. Again, the method propagates signals through the integrated circuit design to output the timing signals (late slack values and early slack values) in item 200.

In this alternative method, for early mode analysis, as indicated by decision box 202, if the late slack value is less than the late slack threshold value, as indicated by decision box 204, the method sets the early proxy slack value to the early slack threshold value, as shown in the item 206. Alternatively, since the objective in this case is to prevent the early proxy slack from being less than the early slack threshold and causing the timing optimization to increase the delay and exacerbate a late mode problem, the method could set the early proxy slack value to max (early slack threshold, early slack). Otherwise, if the late slack value is not less than late slack threshold value, the method restricts the early proxy slack value to a maximum of the early slack value and the early threshold minus the difference between the late slack and late slack threshold as indicated in item 208.

For late mode timing analysis, again as indicated by decision box 202, if the early slack value is less than early slack threshold value, as indicated by decision box 210, the method sets the late proxy slack value to the late slack threshold value in item 212. Alternatively, since the objective in this case is to prevent the late proxy slack from being less than the late slack threshold and thus causing the timing optimization to decrease the delay and exacerbate an early mode problem, the method could set the late proxy slack value to max (late slack threshold, late slack). Otherwise, if the early slack value is not less than early slack threshold value, the method restricts the late proxy slack value to a maximum of absolute values of the late slack value, and the late threshold minus the difference between the early slack and the early slack threshold values in item 214.

This alternative embodiment also performs timing optimization 216 with the early proxy slack value and the late proxy slack value to produce optimized timing values, which are then output 218 as the optimized timing values for the integrated circuit design.

As a further refinement, the method can establish a range of delay ratios from an alpha minimum to an alpha maximum. Thus, when restricting the early proxy slack value in item 208, the method restricts the early proxy slack value to a maximum of the early slack value, and the early slack threshold value minus (the late slack value minus the late slack threshold value, divided by the alpha minimum). Similarly, when restricting the late proxy slack value such a value is restricted to a maximum of the late slack value, and the late slack threshold value minus (the early slack value minus the early slack threshold value, multiplied by the alpha maximum).

The embodiments of the invention can take the form of an entirely hardware embodiment, an entirely software embodiment or an embodiment including both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Thus, as shown above, the methods herein compute a single proxy late (early) mode slack to guide optimization towards those paths which can be improved in a late (early) mode sense without adversely impacting the early (late) mode results. The optimization operations would then operate only on points which have a negative value of this proxy slack, and by doing so would ensure that the improvements to the timing mode under consideration would not cause new timing problems in the other timing mode.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method of optimizing timing of signals within an integrated circuit design using proxy slack values, said method comprising:

propagating signals through said integrated circuit design to output timing signals, wherein said timing signals comprise at least one late slack value associated with a longest path through said integrated circuit design and at least one early slack value associated with a shortest path through said integrated circuit design;

for early mode timing analysis,
setting an early proxy slack value to zero if said late slack value is less than zero, and
if said late slack value is not less than zero, restricting said early proxy slack value to a maximum of the early slack value and the negative of the late slack value;

for late mode timing analysis,
setting a late proxy slack value to zero, if said early slack value is less than zero, and
if said early proxy slack value is not less than zero, restricting said late proxy slack value to a maximum of the late slack value and the negative of the early slack value;

performing timing optimization with said early proxy slack value and said late proxy slack value to produce optimized timing values; and outputting said optimized timing values for said integrated circuit design.

2. The method according to claim 1, wherein said method adjusts said early proxy slack value without affecting said late proxy slack value.

3. The method according to claim 1, wherein said method adjusts said late proxy slack value without affecting said early proxy slack value.

4. A method of optimizing timing of signals within an integrated circuit design using proxy slack values, said method comprising:

establishing an early slack threshold value and a late slack threshold value;

propagating signals through said integrated circuit design to output timing signals, wherein said timing signals comprise at least one late slack value associated with a longest path through said integrated circuit design and at least one early slack value associated with a shortest path through said integrated circuit design;

for early mode analysis,
setting an early proxy slack value to said early slack threshold value if said late slack value is less than late slack threshold value, and
if said late slack value is not less than late slack threshold value, restricting said early proxy slack value to a maximum of the early slack value and the early threshold minus the difference between the late slack value and the late slack threshold value;

for late mode timing analysis,
setting a late proxy slack value to said late slack threshold value if said early slack value is less than early slack threshold value, and
if said early slack value is not less than early slack threshold value, restricting said late proxy slack value to a maximum of absolute values of said late slack value, and the late threshold minus the difference between the early slack value and the early slack threshold values, performing timing optimization with said late proxy slack value and said early proxy slack value to produce optimized timing values; and outputting said optimized timing values for said integrated circuit design.

5. The method according to claim 4, wherein said method further comprises establishing a range of delay ratios from an alpha minimum to an alpha maximum, wherein said restricting of said early proxy slack value comprises restricting said early proxy slack value to a maximum of said early slack value, and said early slack threshold value minus said late slack value minus said late slack threshold value, divided by said alpha minimum.

6. The method according to claim 4, wherein said method further comprises establishing a range of delay ratios from an alpha minimum to an alpha maximum, wherein said restricting of said late proxy slack value comprises restricting said late proxy slack value to a maximum of said late slack value, and said late slack threshold value minus said early slack value minus the early slack threshold value, multiplied by said alpha maximum.

* * * * *

UNITED STATES PATENT AND TRADEMARK OFFICE
CERTIFICATE OF CORRECTION

PATENT NO. : 7,844,933 B2  Page 1 of 1
APPLICATION NO. : 12/113288
DATED : November 30, 2010
INVENTOR(S) : Frank J. Musante et al.

It is certified that error appears in the above-identified patent and that said Letters Patent is hereby corrected as shown below:

On the Title Page, Item (75) Inventors should read -- (75) Inventors: Frank J. Musante, Poughkeepsie, NY (US); David J. Hathaway, Underhill, VT (US); Kerim Kalafala, Rhinebeck, NY (US)

Signed and Sealed this
Twenty-fifth Day of August, 2015

Michelle K. Lee
*Director of the United States Patent and Trademark Office*